(12) United States Patent
Yang

(10) Patent No.: US 7,001,185 B2
(45) Date of Patent: Feb. 21, 2006

(54) CHIP SCALE PACKAGE SOCKET FOR VARIOUS PACKAGE SIZES

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/408,071

(22) Filed: Apr. 4, 2003

(65) Prior Publication Data

US 2004/0017666 A1    Jan. 29, 2004

(30) Foreign Application Priority Data

Jul. 23, 2002    (TW)    ............................... 91116341 A

(51) Int. Cl.
*H01R 12/00*    (2006.01)
*H05K 1/00*    (2006.01)

(52) U.S. Cl. ............................. 439/68; 439/71; 439/73
(58) Field of Classification Search ............... 361/803, 361/704, 785, 690, 695; 439/71, 73, 81, 439/264, 266, 69, 65
See application file for complete search history.

(56) References Cited

U.S. PATENT DOCUMENTS

| | | | |
|---|---|---|---|
| 4,846,703 A * | 7/1989 | Matsuoka et al. | 439/71 |
| 6,027,355 A * | 2/2000 | Ikeya | 439/268 |
| 6,485,321 B1 * | 11/2002 | Trout et al. | 439/342 |

* cited by examiner

Primary Examiner—Chandrika Prasad
(74) Attorney, Agent, or Firm—Ladas & Parry LLP

(57) ABSTRACT

A chip socket scale package. The package presents combined compatibility with two different chip scale package types with solder balls in same position, thereby using only one chip socket scale package.

8 Claims, 6 Drawing Sheets

CHIP SCALE PACKAGE SOCKET FOR VARIOUS PACKAGE SIZES

BACKGROUND OF THE INVENTION

1. Field of the Invention

The present invention relates to a chip scale package chip socket, and in particular a chip socket for two different chip scale package types that have solder balls in the same position.

2. Description of the Related Art

The electronics industry has been progressing with the miniaturization of electronic devices. This trend influences semiconductor packaging technology, which enables the connection between bare IC chips and other components, and enables the connection between bare IC chips and other components. Typically, a semiconductor package has a footprint much larger than that of the chip. To adapt to the miniaturization trend, the size difference between the package and the chip has been reduced, producing a new package type called a Chip scale package (CSP). The solder balls of chip scale package are smaller than ball grid array (BGA) that had arranged according to international standard of Joint Electron Device Engineering Council (JEDEC). When it comes to personal and portable electronic devices, smaller is better, and various products need different chip scale package types and, accordingly, different chip scale package chip sockets. Different chip scale package types need different burn-in board and Hi-Fix and tester change kits that elevate costs.

FIG. 1a and FIG. 1b show schematic diagrams of a conventional chip socket for a first chip socket scale package type 70. The first chip scale package type 70 is square. FIG. 1a shows a schematic diagram of a conventional chip scale package chip socket with the frame switch in first position. FIG. 1b shows a schematic diagram of the conventional chip scale package chip socket with the frame switch in open position. In FIG. 1a and FIG. 1b, the first chip scale package type 70 is on the top of conventional chip scale package chip socket. The first chip scale package type 70 is square. Both sides of the chip have a clamp 72A、72B. The chip has a plurality of solder balls 76 arranged according to international standard of Joint Electron Device Engineering Council (JEDEC).

FIG. 2a and FIG. 2b show a conventional chip socket for the second chip scale package type 80 wherein the second chip scale package type 80 is rectangular. FIG. 2a shows a schematic diagram of a conventional chip socket for second chip scale package type 80 with the frame switch in first position. FIG. 2b shows a schematic diagram of a conventional chip scale package chip socket with the frame switch in open position. Both sides of the chip have a clamp 82A、82B. The chip has a plurality of solder balls 86 arrayed according to international standard of Joint Electron Device Engineering Council (JEDEC).

In FIG. 1a, a chip scale package chip socket comprising a body 10 has a bay 20 for seating first Chip scale package type 70. Electrical connection probes 12 are formed from outside to the bay 20 to electrically connect the chip 70. Two tong members 14A、14B are formed in the body 10 closing to fix a chip in the bay and opening to release the chip. A frame switch 16 is formed on the body 10 moving between a first position and a second position, to move tong members 14A、14B between closed and open position, respectively (see FIGS. 1a and 1b) On the top of the conventional chip scale package chip socket is a first chip scale package type 70, which is square. Both sides of the chip have a clamp 72A、72B. The chip has a plurality of solder balls 76 arrayed according to the international standard of Joint Electron Device Engineering Council (JEDEC).

FIG. 2a shows a schematic diagram of a conventional chip socket for second chip scale package type 80. The chip scale package chip socket comprises at least a body 30 with a bay 40 for seating second chip scale package type 80. Electrical connection probes 32 extend from outside to the bay 40 to electrically connect the chip 80. Two tong members 34A、34B are formed in the body 30 moving between a closed position and an opened position, thereby fixing a chip in bay 40 and releasing the chip, respectively. A frame switch 36 is formed on the body 30 moving between first position and second position, thereby moving tong members 34A、34B between closed and opened position, respectively (see FIGS. 2a and 2b) The second chip scale package type 80, on top of the conventional chip scale package chip socket, is rectangular. Both sides of the chip have a clamp 82A、82B. The chip has a plurality of solder balls 86 arrayed according to international standard of Joint Electron Device Engineering Council (JEDEC).

SUMMARY OF THE INVENTION

Accordingly, an object of the invention is to provide a chip scale package chip socket for first and second chip scale package types.

The chip scale package socket comprises a body having a first bay for seating first chip scale package type and a second bay extending from both sides of the first bay for seating second chip scale package type. Electrical connection probes extend from outside to the bay. Two tong members formed in the body moving between closed and opened position, and a frame switch formed on the body moving between first position and second position, moving the tong members between closed and opened position, respectively.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
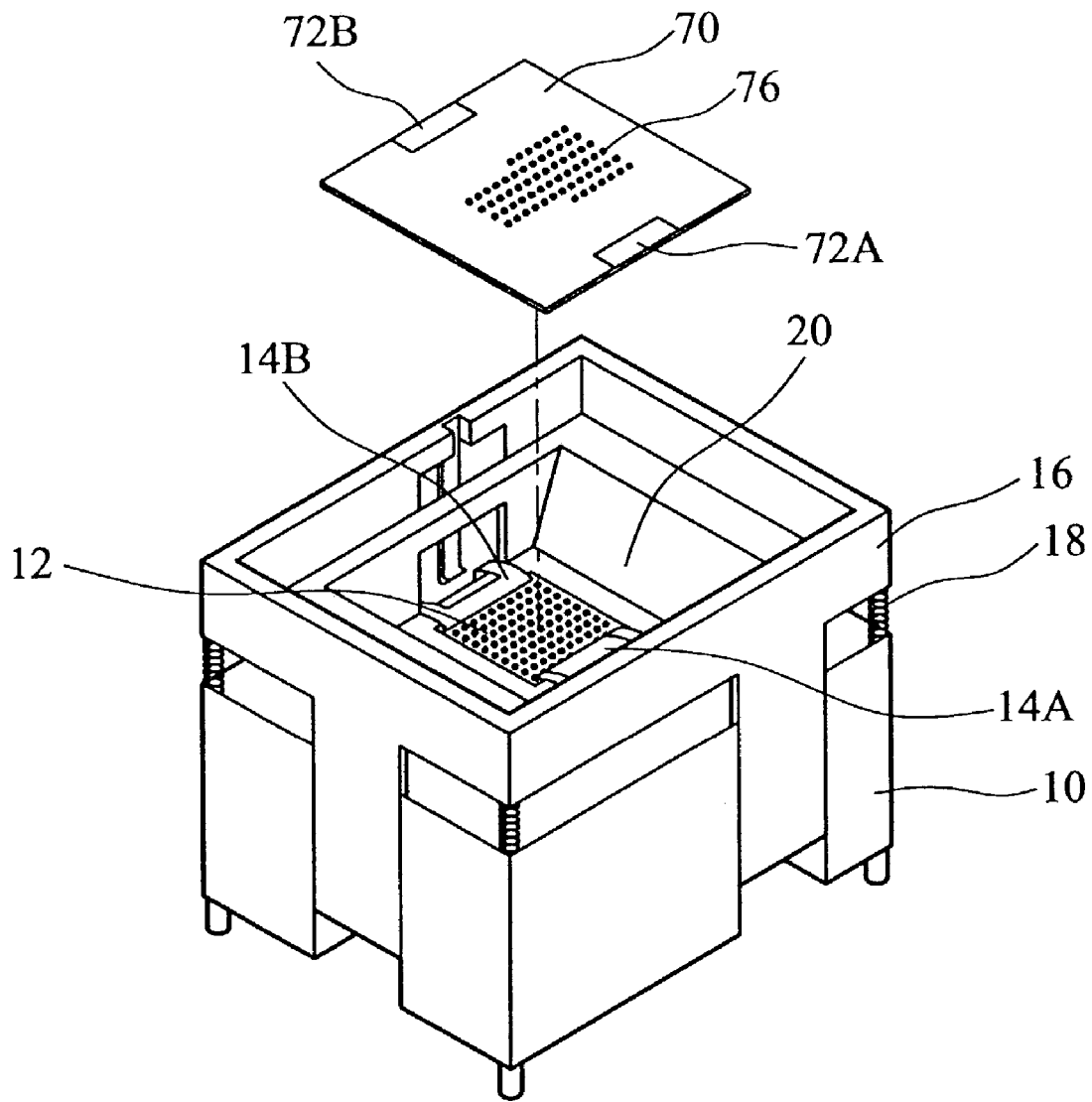
FIG. 1a shows a schematic diagram of a conventional chip socket for first chip scale package type with the frame switch in first position.
Figure 1B:
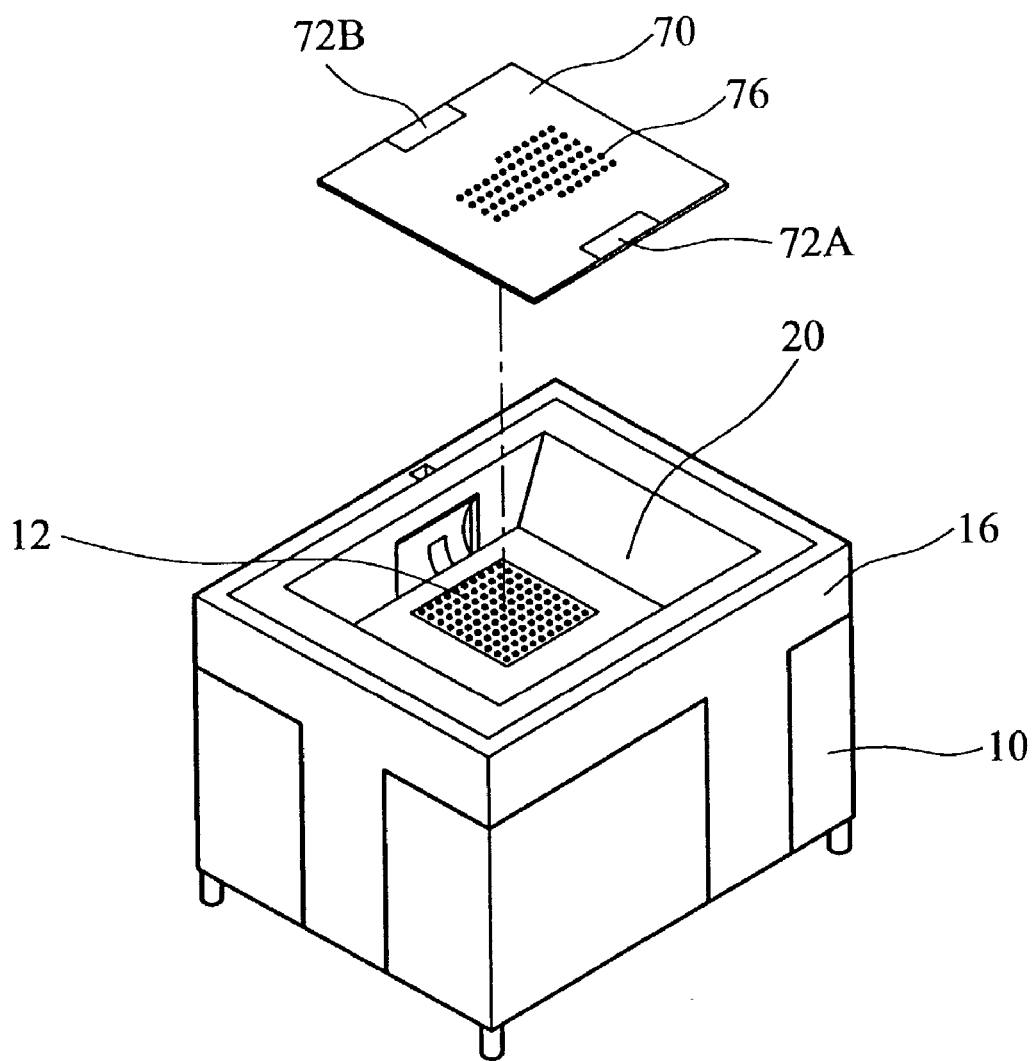
FIG. 1b shows a schematic diagram of a conventional chip socket for first chip scale package type with the frame switch in second position.
Figure 2A:
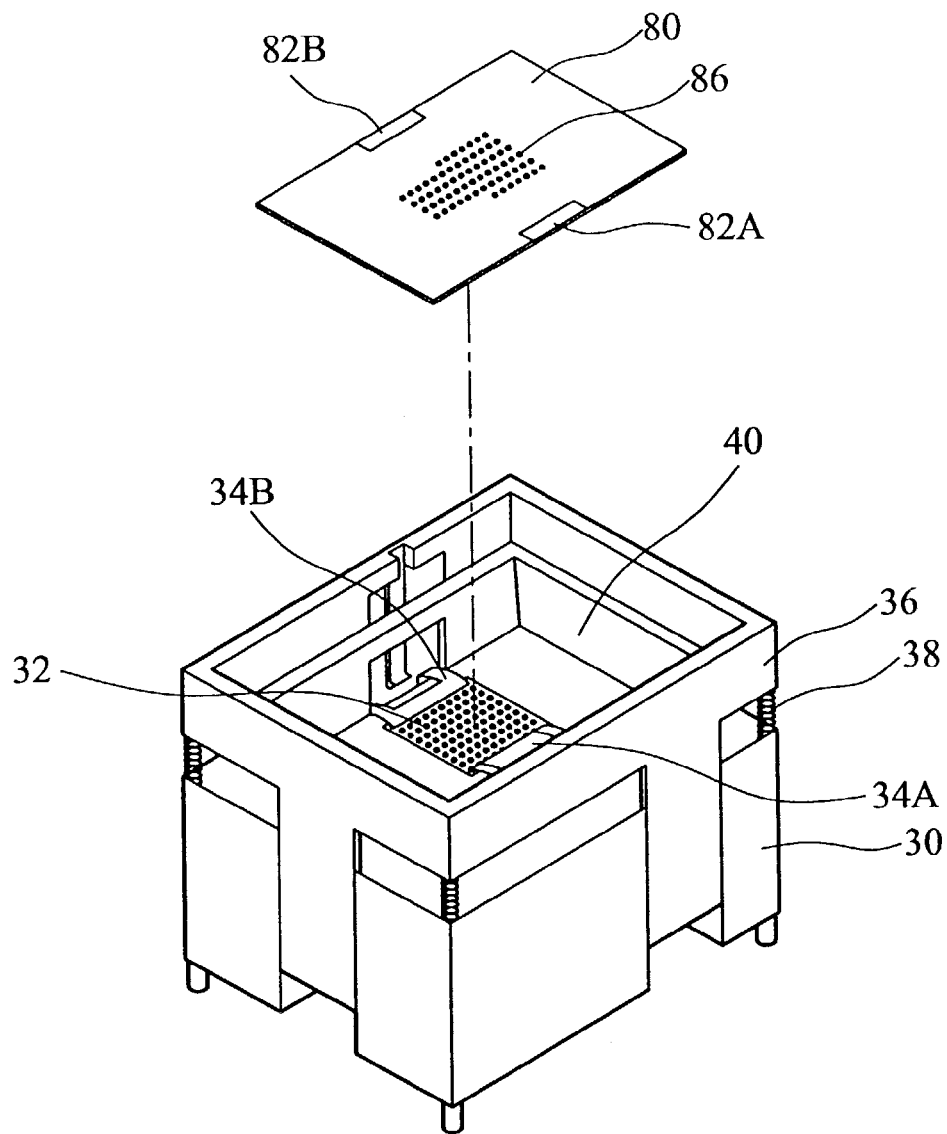
FIG. 2a shows a schematic diagram of a conventional chip socket for second chip scale package type with the frame switch in first position.
Figure 2B:
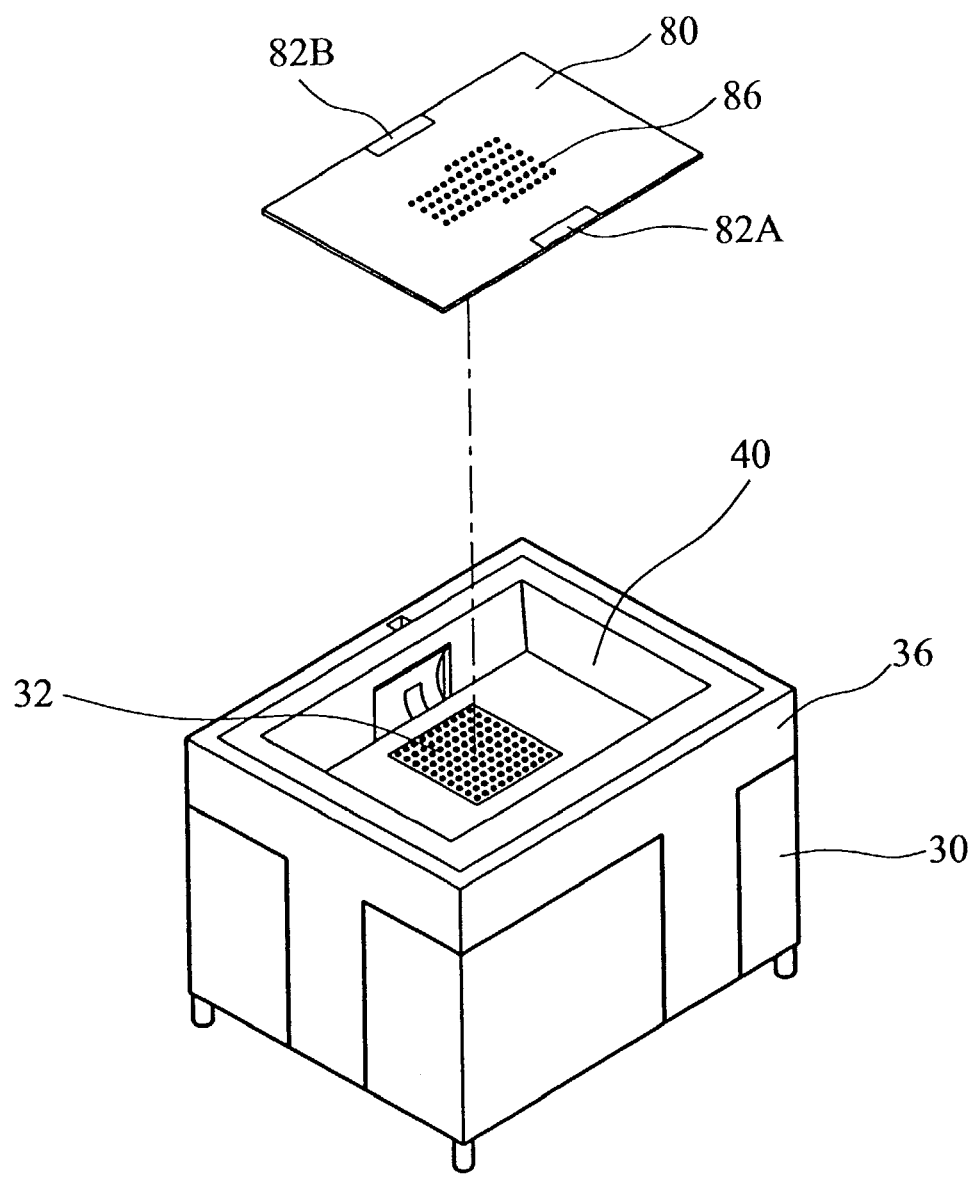
FIG. 2b shows a schematic diagram of a conventional chip socket for second chip scale package type with the frame switch in second position.
Figure 3A:
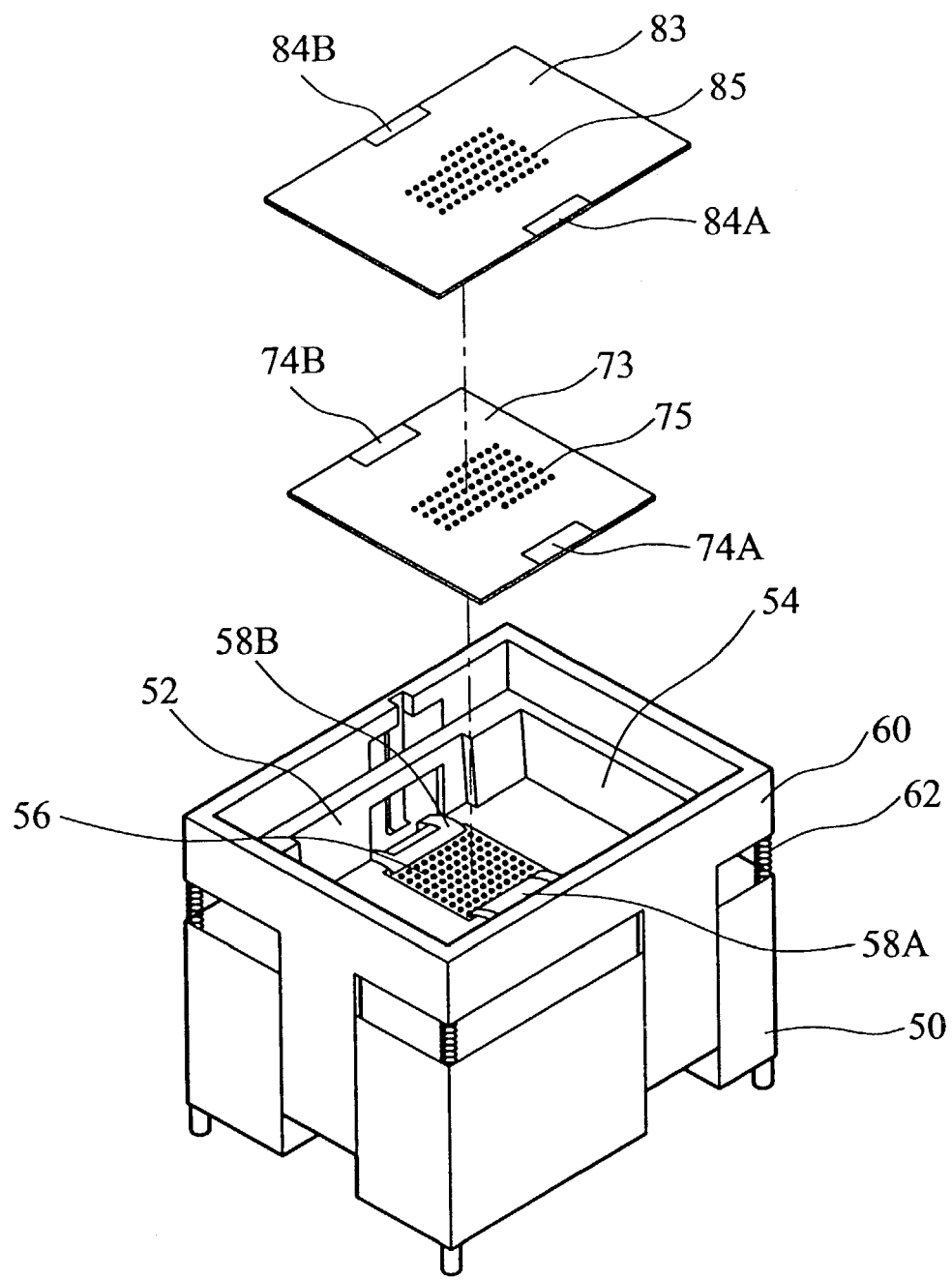
FIG. 3a shows a schematic diagram of chip scale package chip socket of the present invention with frame switch in first position.
Figure 3B:
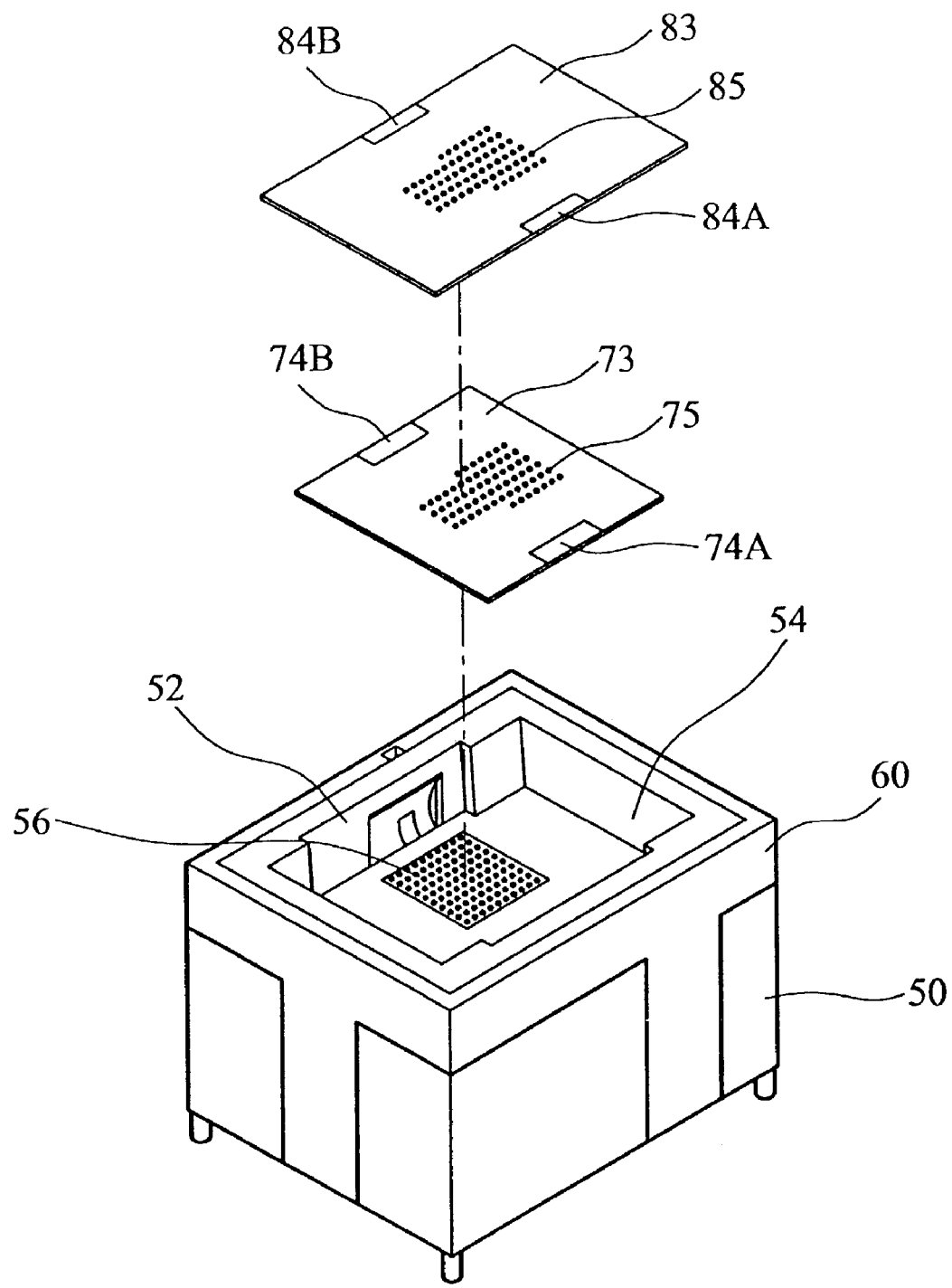
FIG. 3b shows a schematic diagram of chip scale package chip socket of the present invention with frame switch in second position.

FIG. 3a and FIG. 3b show the present invention chip socket for first chip scale package type 73 and second chip scale package type 83 wherein the first chip scale package type 73 is square and the second chip scale package type 83 is rectangular. FIG. 3a shows a schematic diagram of chip scale package chip socket of the present invention with frame switch in first position. FIG. 3b shows a schematic diagram of the chip scale package chip socket of the present invention with frame switch in second position.

FIG. 3a and FIG. 3b show a chip scale package chip socket of the present invention for first chip scale package type 73 and second chip scale package type 83. The chip scale package chip socket comprises at least a body 50 with a first bay 52 for seating first chip scale package type 73. The second bay 54 extends from both sides of the first bay 52 to seat second chip scale package type 83. Electrical connection probes 56 extend from outside to the bay to electrically connect the chip. Two tong members 58A、58B are formed in the body 50 moving between closed and open positions, thereby fixing and releasing a chip in the bay, respectively. A frame switch 60 is formed on the body 50 moving between first position and second position, to move the tong members 58A、58B between closed and open positions, respectively. FIG. 3a and FIG. 3b show a chip scale package chip socket for first chip scale package type 73 and second chip scale package type 83. The first chip scale package type 73 is square. The second chip scale package type 83 is rectangular. On both sides of first chip scale package type 73 are clamps 74A、74B. On both sides of second chip scale package type 83 are clamps 84A、84B. The chip has a plurality of solder balls 75 arrayed according to international standard of Joint Electron Device Engineering Council (JEDEC). A chip has a plurality of solder balls 85 arrayed according to international standard of Joint Electron Device Engineering Council (JEDEC).

Finally, while the invention has been described by way of example and in terms of the above preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip scale package socket for first and second chip scale package types of different sizes, comprising:
    a body having a first bay comprising a first side and a second side for receiving a first chip scale package type of a first size and a second bay extending from the first side and the second side of the first bay for receiving a second chip scale package type of a second different size;
    electrical connection probes extending from outside to the first bay;
    two tong members formed in the body movable between closed and opened positions to secure or release the chip scale package types; and
    a frame switch formed on the body movable between a first position and a second position so as to move the tong members between the closed and opened positions, respectively.

2. A chip scale package socket according to claim 1, further comprising an elastic component formed between the body and frame switch to move the frame switch into the first position.

3. A chip scale package socket according to claim 1, wherein the first bay is square and the second bay is rectangular.

4. A chip scale package socket according to claim 2, wherein the first bay is square and the second bay is rectangular.

5. A chip scale package socket, comprising:
    a body comprising an opening for receiving at least first and second chip packages having different sizes, wherein the opening is defined by a plurality of planar wall sections divided into at least a first set and a second set of wall sections, the planar wall sections joining neighboring planar wall sections so as to define a closed geometric form, wherein the first set of wall sections receives the first chip package size and wherein the second set of wall sections receives the second chip package size;
    electrical connection probes extending from outside to the opening;
    two tong members formed in the body movable between closed and opened positions to secure or release the chip package; and
    a frame switch formed on the body movable between a first position and a second position so as to move the tong members between the closed and opened positions, respectively.

6. A chip scale package socket according to claim 5 further comprising an elastic component formed between the body and frame switch to move the frame switch into the first position.

7. A chip scale package socket according to claim 5, wherein the first set of wall sections comprises planar wall sections which form a square, and the second set of wall sections comprises planar wall sections which form a rectangle.

8. A chip scale package socket according to claim 6, wherein the first set of wall sections comprises planar wall sections which form a square, and the second set of wall sections comprises planar wall sections which form a rectangle.

* * * * *